United States Patent
Chiang et al.

(10) Patent No.: US 10,164,063 B2
(45) Date of Patent: Dec. 25, 2018

(54) SEMICONDUCTOR STRUCTURE WITH PROTECTION LAYER

(71) Applicant: Taiwan Semiconductor Manufacturing Co., Ltd., Hsinchu (TW)

(72) Inventors: Chih-Wei Chiang, Zhubei (TW); Po-Hsiung Leu, Taoyuan (TW); Ding-I Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/434,343

(22) Filed: Feb. 16, 2017

(65) Prior Publication Data

US 2018/0166560 A1     Jun. 14, 2018

Related U.S. Application Data

(60) Provisional application No. 62/434,134, filed on Dec. 14, 2016.

(51) Int. Cl.
 *H01L 29/78* (2006.01)
 *H01L 21/82* (2006.01)
 (Continued)

(52) U.S. Cl.
 CPC .. *H01L 29/66795* (2013.01); *H01L 21/82345* (2013.01); *H01L 21/823431* (2013.01);
 (Continued)

(58) Field of Classification Search
 CPC ......... H01L 29/66545; H01L 29/66871; H01L 21/823468; H01L 21/8236; H01L 29/66689; H01L 29/785; H01L 29/66795; H01L 27/1211; H01L 27/0886; H01L 27/0924; H01L 21/845; H01L 21/823821; H01L 21/823857; H01L 29/6656; H01L 29/44983; H01L 21/823431; H01L 21/823456; H01L 21/823462
 See application file for complete search history.

(56) References Cited

U.S. PATENT DOCUMENTS 8,487,378 B2   7/2013   Goto et al.
8,729,634 B2   5/2014   Shen et al.
(Continued)

*Primary Examiner* — Thanhha Pham
(74) *Attorney, Agent, or Firm* — Birch, Stewart, Kolasch & Birch, LLP

(57) ABSTRACT

The method for forming a semiconductor structure includes forming a protection layer having a first portion and a second portion over a substrate and forming a dummy gate layer over the first portion and the second portion of the protection layer. The method for forming a semiconductor structure further includes patterning the dummy gate layer to form a dummy gate structure over the first portion of the protection layer and forming a spacer on a sidewall of the dummy gate structure over a second portion of the protection layer. The method for forming a semiconductor structure further includes replacing the first portion of the protection layer and the dummy gate structure by a gate dielectric layer and a gate electrode layer. In addition, a thickness of the protection layer is greater than a thickness of the gate dielectric layer.

20 Claims, 11 Drawing Sheets

(51) Int. Cl.
*H01L 29/66* (2006.01)
*H01L 29/423* (2006.01)
*H01L 29/49* (2006.01)
*H01L 27/088* (2006.01)
*H01L 21/8234* (2006.01)

(52) U.S. Cl.
CPC ........ *H01L 21/823456* (2013.01); *H01L 21/823462* (2013.01); *H01L 21/823468* (2013.01); *H01L 27/088* (2013.01); *H01L 27/0886* (2013.01); *H01L 29/42364* (2013.01); *H01L 29/4983* (2013.01); *H01L 29/6656* (2013.01); *H01L 29/66545* (2013.01); *H01L 29/785* (2013.01)

(56) References Cited

U.S. PATENT DOCUMENTS

| | | | |
|---|---|---|---|
| 8,826,213 B1 | 9/2014 | Ho et al. | |
| 8,887,106 B2 | 11/2014 | Ho et al. | |
| 2014/0001540 A1* | 1/2014 | Wang | H01L 29/66666 257/329 |
| 2014/0070285 A1* | 3/2014 | Xie | H01L 29/66545 257/288 |
| 2014/0282326 A1 | 9/2014 | Chen et al. | |
| 2016/0064225 A1* | 3/2016 | Kim | H01L 29/511 438/591 |
| 2016/0181384 A1* | 6/2016 | Liu | H01L 29/4236 257/335 |

* cited by examiner

SEMICONDUCTOR STRUCTURE WITH PROTECTION LAYER

PRIORITY CLAIM AND CROSS-REFERENCE

This Application claims the benefit of U.S. Provisional Application No. 62/434,134, filed on Dec. 14, 2016, and entitled "Semiconductor structure with protection layer and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Semiconductor devices may include core devices and input/output devices. The core devices may be used to perform the functions of a chip, and the input/output devices may be used to communicate with external circuits in other chips. Although existing manufacturing processes for these semiconductor devices have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
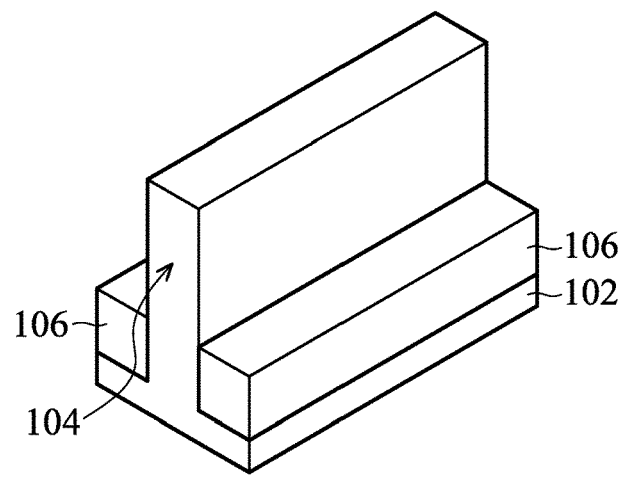
FIGS. 1A to 1J are perspective representations of various stages of forming a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of semiconductor structures and methods for forming the same are provided. The method for forming the semiconductor structure may include forming a protection layer over a substrate before a dummy gate layer is formed, so that the protection layer may protect the substrate during the process of patterning the dummy gate layer. In addition, the protection layer may be relatively thick to provide better protection for the substrate and may be removed afterwards, so that the performance of the resulting semiconductor structure may be improved.

FIGS. 1A to 1J are perspective representations of various stages of forming a semiconductor structure 100 in accordance with some embodiments. As shown in FIG. 1A, a substrate 102 is provided in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

A fin structure 104 is formed from the substrate 102, and an isolation structure 106 is formed around the fin structure 104, as shown in FIG. 1A in accordance with some embodiments. The fin structure 104 may be formed by patterning the substrate 102. The isolation structure 106 may be formed by forming an insulating material over the substrate 102 and the fin structure 104 and recessing the insulating material to expose the top portion of the fin structure 104. In some embodiments, the insulating material is made of silicon oxide, silicon nitride, silicon oxynitride, fluoride-doped silicate glass (FSG), or other low-K dielectric materials. The insulating material may be formed by using a high-density-plasma (HDP) CVD process, although other deposition processes may be used in other embodiments.

Figure 1B:
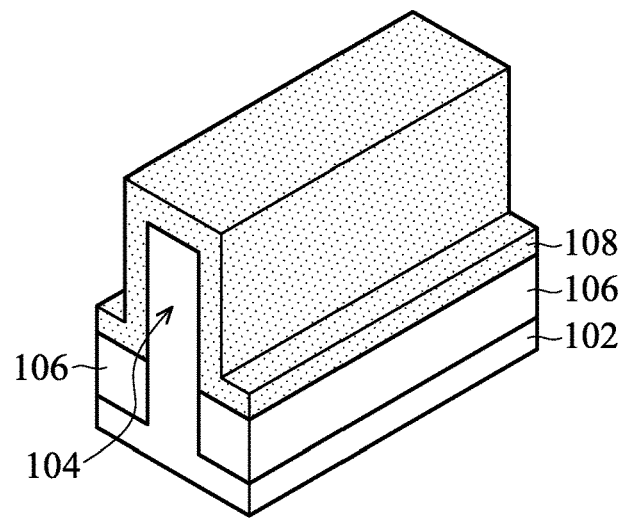

Next, a protection layer 108 is formed over the fin structure 104 and the isolation structure 106, as shown in FIG. 1B in accordance with some embodiments. As shown in FIG. 1B, the protection layer 108 is formed over the top surface of the sidewalls of the fin structure 104 and extends over the top surface of the isolation structure 106. The protection layer 108 may be configured to prevent the substrate 102 and the elements formed over the substrate (e.g. the fin structure 104 and the isolation structure 106)

from being damaged in subsequent manufacturing processes, and therefore the protection layer 108 may be relatively thick to protect the elements below it.

In some embodiments, the protection layer 108 has a thickness in a range from about 20 Å to about 100 Å. The protection layer 108 should be thick enough to protect the structure formed below it, while not being too thick or it may be too difficult to be completely removed and therefore undermine the performance of the resulting semiconductor structure.

In some embodiments, the protection layer 108 is an oxide layer. In some embodiments, the protection layer 108 is a silicon oxide layer. In some embodiments, the protection layer 108 is made of metal oxides, metal nitrides, metal silicates, transition metal-oxides, transition metal-nitrides, transition metal-silicates, or oxynitrides of metals. Examples of materials used to form the protection layer 108 include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

Figure 1C:
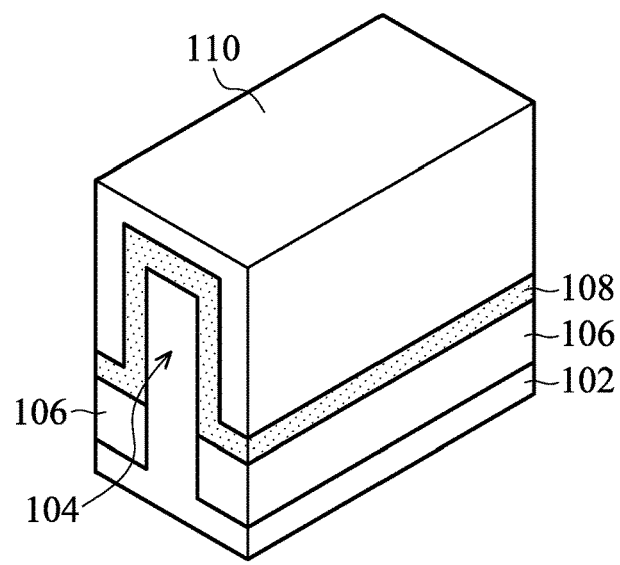

After the protection layer 108 is formed, a dummy gate layer 110 is formed over the protection layer 108, as shown in FIG. 1C in accordance with some embodiments. In some embodiments, the dummy gate layer 110 is a polysilicon layer.

Figure 1D:
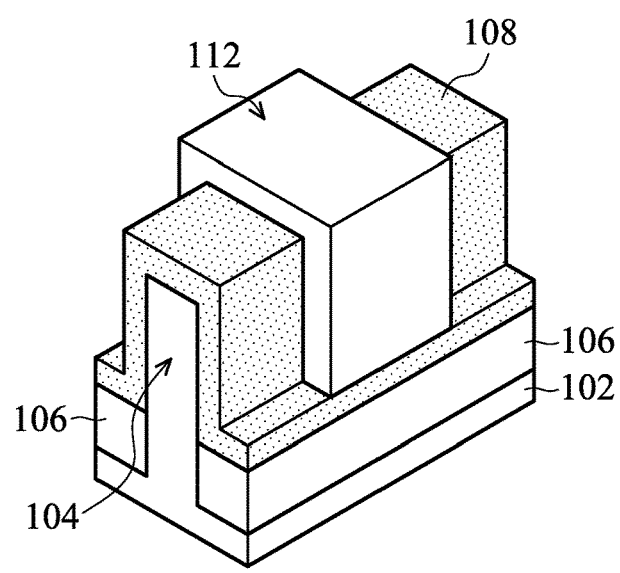

Next, the dummy gate layer 110 is patterned to form a dummy gate structure 112, as shown in FIG. 1D in accordance with some embodiments. The dummy gate layer 110 may be patterned by forming a mask over a portion of the dummy gate layer 110 and etching the portions of the dummy gate layer 110 not covered by the mask. The dummy gate layer 110 may be etched by performing a dry etching process. The dry etching process may be designed to be stopped when the protection layer 108 is exposed. In addition, as described previously, the protection layer 108 is relatively thick, so that even if some top portions of the protection layer 108 are removed during the etching process, the structure formed underneath (e.g. the fin structure 104 and/or the isolation structure 106) can still be well protected and therefore will not be damaged.

Figure 1E:
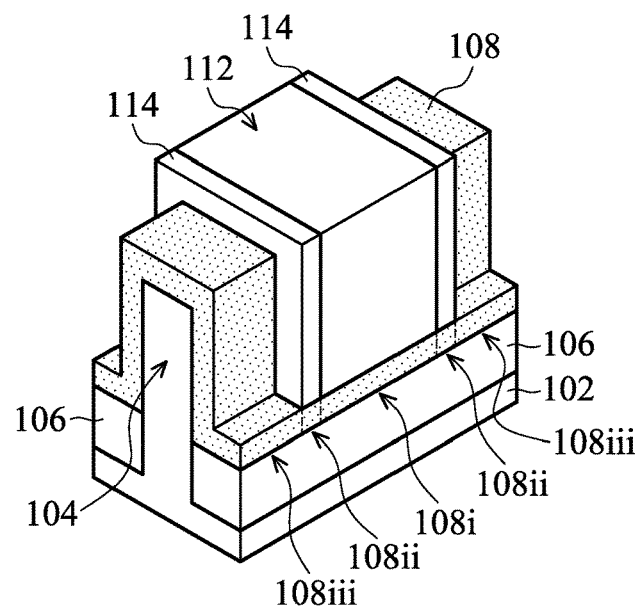

After the dummy gate layer 110 is patterned to form the dummy gate structure 112 over the protection layer 108, spacers 114 are formed on the sidewalls of the dummy gate structure 112, as shown in FIG. 1E in accordance with some embodiments. In addition, the spacers 114 also cover portions of the protection layer 108.

As shown in FIG. 1E, the protection layer 108 includes a first portion 108i, second portions 108ii, and third portions 108iii, and the dummy gate structure 112 is located over a first portion 108i of the protection layer 108 and the spacers 114 are formed over the second portions 108ii of the protection layer 108. In addition, the second portions 108ii of the protection layer 108 are located at the opposite sides of the first portion 108i of the protection layer 108, and the third portions 108iii are further apart from the first portion 108i of the protection layer 108.

In some embodiments, the spacers 114 are made of silicon nitride, silicon oxide, silicon oxynitride, silicon carbide, or other applicable dielectric materials. In some embodiments, the spacers 114 and the protection layer 108 are made of different materials so that they may have relatively good etching selectivity in subsequent etching processes.

Figure 1F:
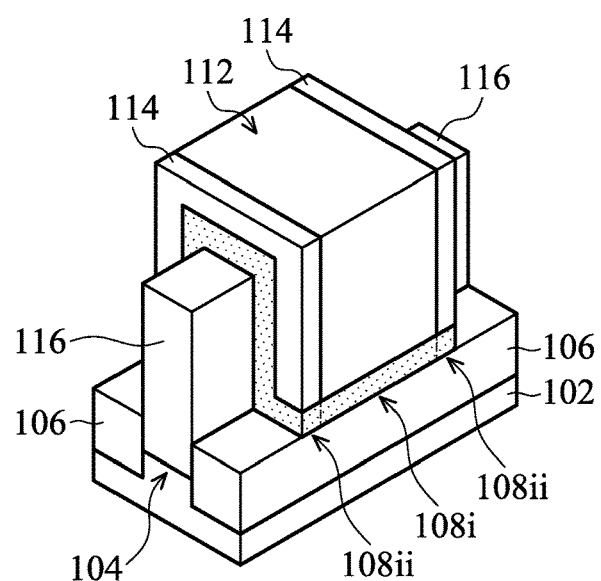
Figure 1G:
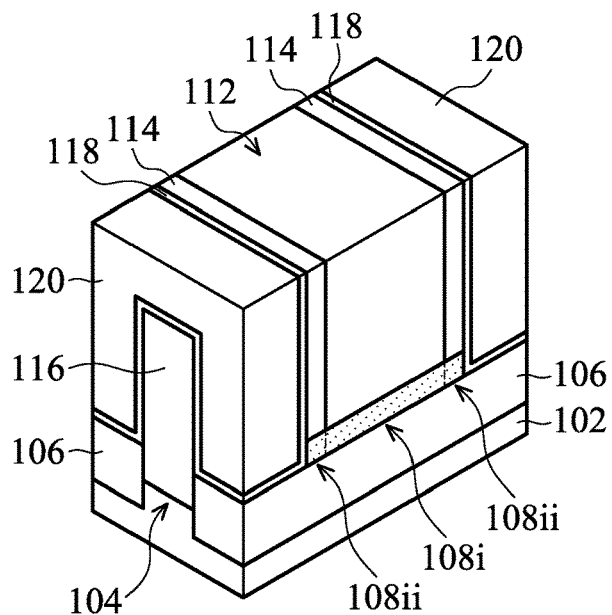

After the spacers 114 are formed, the exposed portions of the protection layer 108 are removed, as shown in FIG. 1F in accordance with some embodiments. That is, the third portions 108iii of the protection layer 108 not covered by the dummy gate structure 112 and the spacers 114 are removed. In some embodiments, the third portions 108iii of the protection layer 108 are removed by performing an etching process.

Afterwards, source/drain structures 116 are formed in the fin structure 104 adjacent to the dummy gate structure 112, as shown in FIG. 1F in accordance with some embodiments. In addition, the source/drain structures 116 are formed at opposite sides of the dummy gate structure 112 in accordance with some embodiments. The source/drain structures 116 may be formed by recessing the fin structure 104 and growing semiconductor materials in the recesses by performing epitaxial (epi) processes. In some embodiments, the source/drain structures 116 include Ge, SiGe, InAs, InGaAs, InSb, GaAs, GaSb, InAlP, InP, or a combination thereof.

Figure 1H:
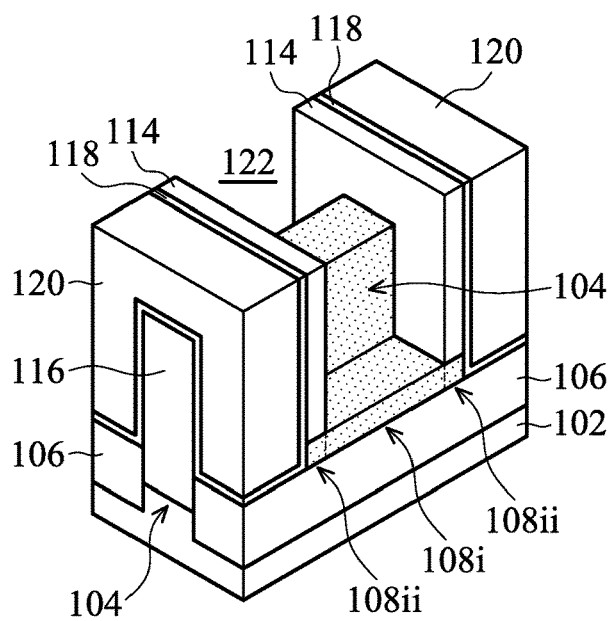

After the source/drain structures 116 are formed, a contact etch stop layer (CESL) 118 is formed over substrate 102, and an interlayer dielectric layer 120 is formed over the contact etch stop layer 118, as shown in FIG. 1H in accordance with some embodiments. In some embodiments, the contact etch stop layer 118 is made of silicon nitride, silicon oxynitride, and/or other applicable materials. The contact etch stop layer 118 may be formed by performing plasma enhanced CVD, low pressure CVD, ALD, or other applicable processes.

The interlayer dielectric layer 120 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 236 may be formed by performing chemical vapor deposition (CVD), physical vapor deposition, (PVD), atomic layer deposition (ALD), spin-on coating, or other applicable processes.

Next, the dummy gate structure 112 is removed to form a trench 122 between the spacers 114, as shown in FIG. 1H in accordance with some embodiments. In some embodiments, the dummy gate structure 112 is removed by performing a dry etching process. As shown in FIG. 1H, after the dummy gate structure 112 is removed, the first portion 108i of the protection layer 108 is exposed by the trench 122 while the second portions 108ii of the protection layer 108 are covered by the spacers 114.

Figure 1I:
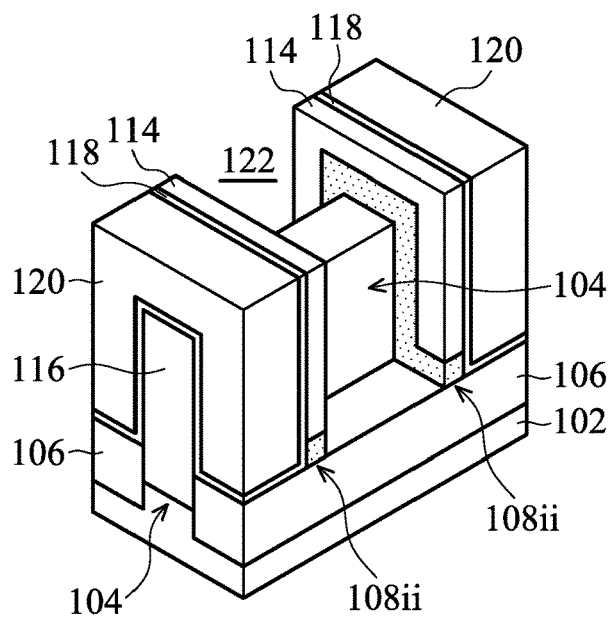

Next, the first portion 108i of the protection layer 108 exposed by the trench 122 is removed, as shown in FIG. 1I in accordance with some embodiments. In some embodiments, the first portion 108i of the protection layer 108 is removed by performing a dry etching process. As shown in FIG. 1I, some portions of the fin structure 104 and the isolation structure 106 are exposed by the trench 122 after the first portion 108i of the protection layer 108 is removed.

Figure 1J:
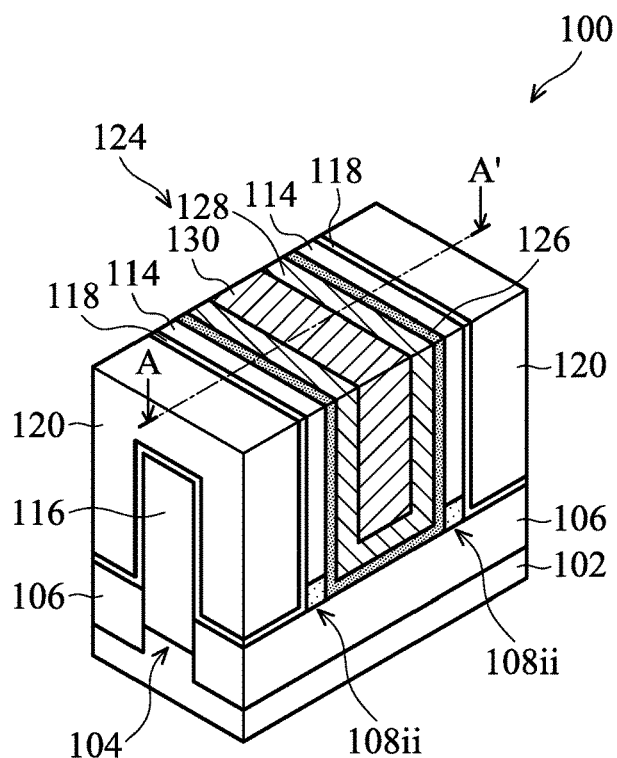

Afterwards, a metal gate structure 124 is formed in the trench 122, as shown in FIG. 1J in accordance with some embodiments. In some embodiments, the metal gate structure 124 in the semiconductor structure 100 includes a gate dielectric layer 126, a work function metal layer 128, and a gate electrode layer 130. Since the first portion 108i of the protection layer 108 is removed before the metal gate structure 124 is formed, the metal gate structure 124 is formed directly on the fin structure 104 and the isolation structure 106.

In some embodiments, the gate dielectric layer 126 and the protection layer 108 are made of the same material, but the protection layer 108 is thicker than the gate dielectric layer 126. As described previously, the protection layer 108 is formed to protect the structures under it (e.g. the fin structure 104 and the isolation structure 106) during subsequent etching processes. Therefore, the protection layer 108 is designed to be relatively thick. On the other hand, the thickness of the gate dielectric layer 126 is designed to be relatively thin, so that the resulting semiconductor structure 100 may have a lower resistance.

In some embodiments, the difference between the thickness of the protection layer 108 and the thickness of the gate dielectric layer 126 is in a range from about 5 Å to about 80 Å. As described above, the difference of the thicknesses between the protection layer 108 and the gate dielectric layer 126 is adjusted, so that the structure under the protection layer 108 can be well protected in previous manufacturing processes (e.g. the etching process shown in FIG. 1D) while the resulting semiconductor structure 100 can still have a relatively low resistance.

In some embodiments, the gate dielectric layer 126 is an oxide layer. In some embodiments, the gate dielectric layer 126 is a silicon oxide layer. In some embodiments, the gate dielectric layer 126 is made of metal oxides, metal nitrides, metal silicates, transition metal-oxides, transition metal-nitrides, transition metal-silicates, or oxynitrides of metals. Examples of materials used to form the gate dielectric layer 240 include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

In some embodiments, the work function metal layer 128 is formed over the gate dielectric layer 126. The work function metal layer 128 may be tuned to have the proper work function. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC), aluminides, and/or other applicable materials.

In some embodiments, the gate electrode layer 130 is formed over the work function metal layer 128. In some embodiments, the gate electrode layer 130 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials.

As described previously, the protection layer 108 is formed over the fin structure 104 and the isolation structure 106 before the dummy gate layer 110 is formed. Therefore, the protection layer 108 can protect the structure below it from being damaged during the etching process for patterning the dummy gate layer 110. In addition, the first portion 108i of the protection layer 108 located under the dummy gate structure 112 is replaced by a relatively thin gate dielectric layer 126, and therefore the resulting semiconductor structure 100 can still have a relatively low resistance. Since damage to the fin structure 104 and the isolation structure 106 can be prevented while the semiconductor structure 100 can still have a relatively thin gate dielectric layer 126, the performance of the semiconductor structure 100 can be improved.

It should be noted that, although the first portion 108i, the second portions 108ii and the third portions 108iii of the protection layer 108 are shown in the figures described above, there are no real boundaries (e.g. interfaces) between each portion. That is, these portions are merely shown to provide a better understanding of the concept of the disclosure, but the scope of the disclosure is not intended to be limiting.

Figure 2:
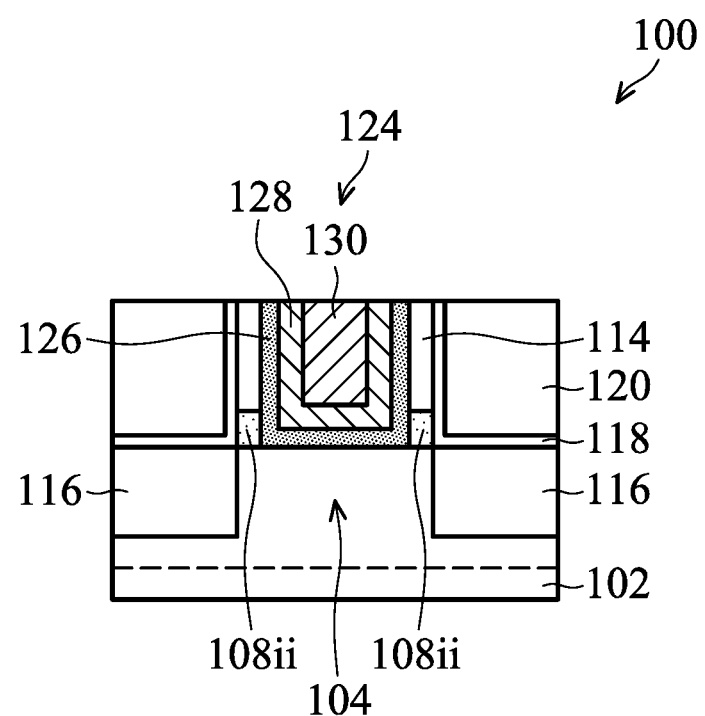
FIG. 2 is a cross-sectional representation of the semiconductor structure shown alone line A-A' in FIG. 1J in accordance with some embodiments.

FIG. 2 is a cross-sectional representation of the semiconductor structure 100 shown alone line A-A' in FIG. 1J in accordance with some embodiments. As shown in FIG. 2, the semiconductor structure 100 includes the metal gate structure 124, and the metal gate structure 124 includes the gate dielectric layer 126, which is thinner than the second portion 108ii of the protection layer. In addition, the gate dielectric layer 126 is in direct contact with both the spacer 114 and the second portion 108ii of the protection layer, and the spacer 114 is located at the upper portion of the gate dielectric layer 126 and the second portion 108ii of the protection layer is located at the bottom portion of the gate dielectric layer 126. In some embodiments, the interface between the spacer 114 and the second portion 108ii of the protection layer is at a higher position than the bottom surface of the work function metal layer 128, which means that the protection layer is thick enough to protect the fin structure 104 underneath.

As described previously, the gate dielectric layer 126 and the protection layer 108 (i.e. the second portion 108ii of the protection layer 108) may be made of the same material. In some embodiments, the gate dielectric layer 126 and the second portion 108ii of the protection layer are made of a same oxide, such that an oxide layer is position between the work function metal layer 128 of the gate structure 124 and the spacer 114 and further extends under the work function metal layer 128 and the spacer 114. In addition, the extending portion of the oxide layer located under the spacer 114 (i.e. the second portion 108ii of the protection layer 108) is thicker than the extending portion of the oxide layer located under the work function metal layer 128 (i.e. the gate dielectric layer 126).

FIGS. 3A to 3I are cross-sectional representations of various stages of forming a semiconductor structure 200 in accordance with some embodiments. Some materials and processes used to form the semiconductor structure 200 may be similar to, or the same as, those used to form the semiconductor structure 100 and are not repeated herein.

Figure 3A:
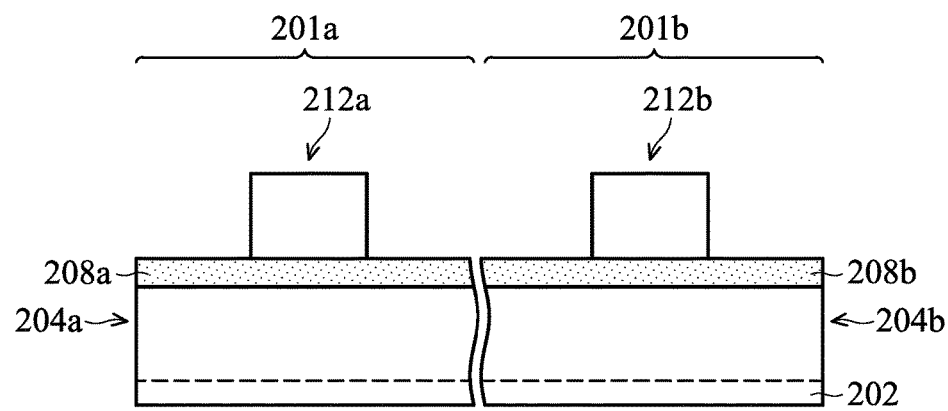
FIGS. 3A to 3I are cross-sectional representations of various stages of forming a semiconductor structure in accordance with some embodiments.

As shown in FIG. 3A, a substrate 202 includes a first region 201a and a second region 201b in accordance with some embodiments. In some embodiments, the first region 201a is a core region, and the second region 201b is an input/output region. Core devices may be formed in the core region to perform the designed functions of the semiconductor structure, and input/output devices may be formed in the input/output region to communicate with external circuits.

Similar to the processes described previously related to FIG. 1A, a first fin structure 204a and a second fin structure 204b may be formed from the substrate 202 in accordance with some embodiments. In addition, the first fin structure 204a is formed over the first region 201a, and the second fin structure 204b is formed in the second region 201b in accordance with some embodiments.

Next, a first protection layer 208a is formed over the first region 201a of the substrate 102, and a second protection layer 208b is formed over the second region 201b of the substrate 102, as shown in FIG. 3A in accordance with some embodiments. The first protection layer 208a and the second protection layer 208b may be similar to the protection layer 108 described previously and are configured to prevent the substrate 202 and the elements formed over the substrate (e.g. the first fin structure 204a and the second fin structure 204b) from being damaged in subsequent manufacturing processes. That is, the first protection layer 208a and the second protection layer 208b may be relatively thick.

In addition, although the first protection layer 208a and the second protection layer 208b are formed over different regions of the substrate 202, they may be formed by performing a single depositing process in accordance with some embodiments. Since the first protection layer 208a and the second protection layer 208b may be formed by the same process, the thickness of the first protection layer 208a may be substantially equal. In some embodiments, both the thickness of the first protection layer 208a and the thickness of the second protection layer 208b are in a range from about 20 Å to about 100 Å. As described previously, the first protection layer 208a and the second protection layer 208b should be thick enough to protect the substrate 202 underneath in subsequent manufacturing processes. The materials used to form the first protection layer 208a and the second protection layer 208b may be similar to those used to form the protection layer 108 and are not repeated herein.

After the first protection layer 208a and the second protection layer 208b are formed, a first dummy gate structure 212a and a second dummy gate structure 212b are formed over the first protection layer 208a and the second protection layer 208b respectively, as shown in FIG. 3A in accordance with some embodiments. As described previously, the first protection layer 208a and the second protection layer 208b may be configured to protect the first fin structure 204a and the second fin structure 204b during the etching process for forming the first dummy gate structure 212a and the second dummy gate structure 212b.

Figure 3B:
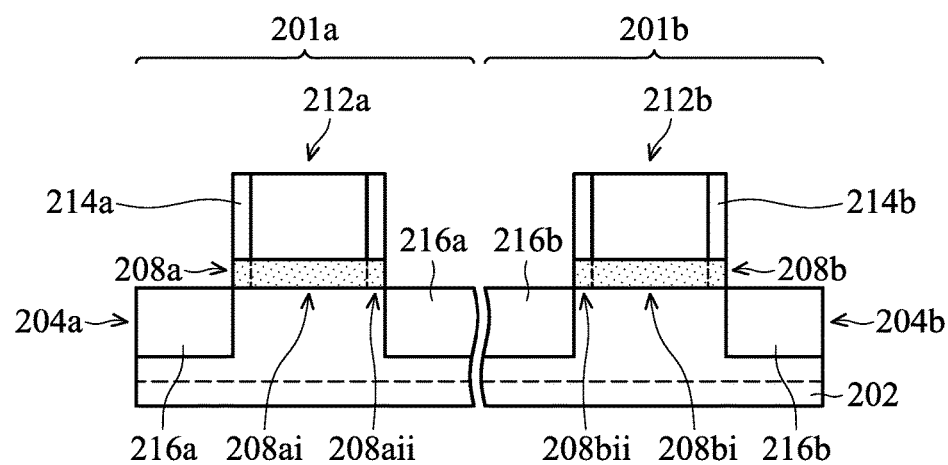

Next, first spacers 214a and second spacers 214b are formed on the sidewalls of the first dummy gate structure 212a and the second dummy gate structure 212b respectively, as shown in FIG. 3B in accordance with some embodiments. Afterwards, the portions of the first protection layer 208a and the second protection layer 208b not covered by the first dummy gate structure 212a, the first spacers 214a, the second dummy gate structure 212b, or the second spacers 214b are removed, as shown in FIG. 3B in accordance with some embodiments. In some embodiments, the first dummy gate structure 212a is formed over a first portion 208ai of the first protection layer 208a, and the first spacers 214a are formed over second portions 208aii of the first protection layer 208a. Similarly, the second dummy gate structure 212b is formed over a second portion 208bi of the second protection layer 208b, and the second spacers 214b are formed over second portions 208bii of the second protection layer 208b in accordance with some embodiments.

Figure 3C:
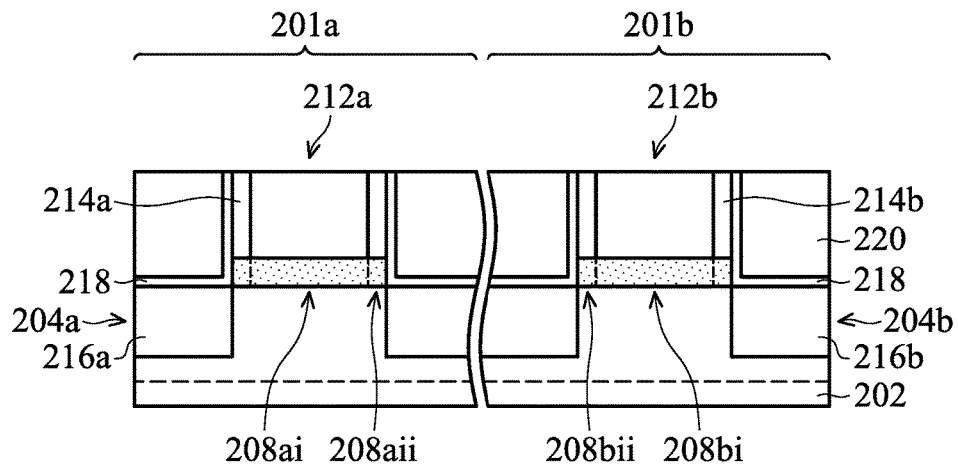

Afterwards, first source/drain regions 216a are formed in the first region 201a of the substrate 102 and at opposite sides of the first dummy gate structure 212a, and second source/drain regions 216b are formed in the second region 201b of the substrate 102 and at opposite sides of the second dummy gate structure 212b, as shown in FIG. 3B in accordance with some embodiments. After the first source/drain regions 216a and the second source/drain regions 216b are formed, a contact etch stop layer (CESL) 218 is conformally formed over the substrate 202, and an interlayer dielectric layer 220 is formed over the contact etch stop layer 218 and the top portion of the contact etch stop layer 218 and the interlayer dielectric layer 220 are polished until the top surfaces of the first dummy gate structure 212a and the second dummy gate structure 212b are exposed, as shown in FIG. 3C in accordance with some embodiments.

Figure 3D:
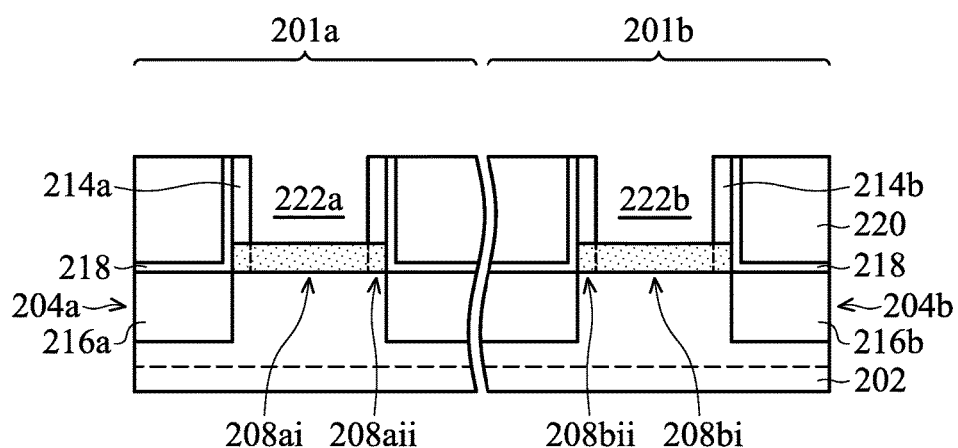

Next, the first dummy gate structure 212a and the second dummy gate structure 212b are removed to form a first trench 222a and a second trench 222b, as shown in FIG. 3D in accordance with some embodiments. As shown in FIG. 3D, after the first dummy gate structure 212a and the second dummy gate structure 212b are removed, the first portion 208ai of the first protection layer 208a is exposed by the first trench 222a, and the first portion 208bi of the second protection layer 208b is exposed by the second trench 222b.

Figure 3E:
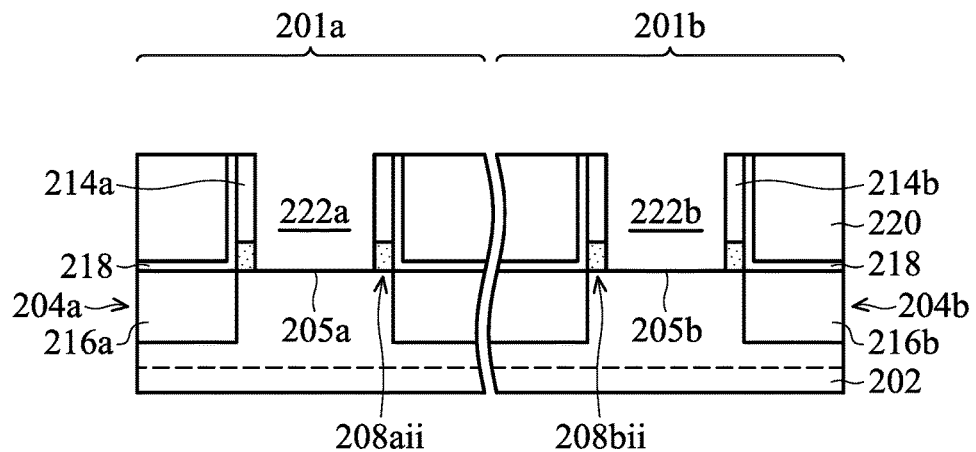

After the first dummy gate structure 212a and the second dummy gate structure 212b are removed, the first portion 208ai of the first protection layer 208a and the first portion 208bi of the second protection layer 208b are removed, as shown in FIG. 3E in accordance with some embodiments. As shown in FIG. 3E, a top surface 205a of the first fin structure 204a is exposed by the first trench 222a, and a top surface 205b of the second fin structure 204b is exposed by the second trench 222b in accordance with some embodiments.

Figure 3F:
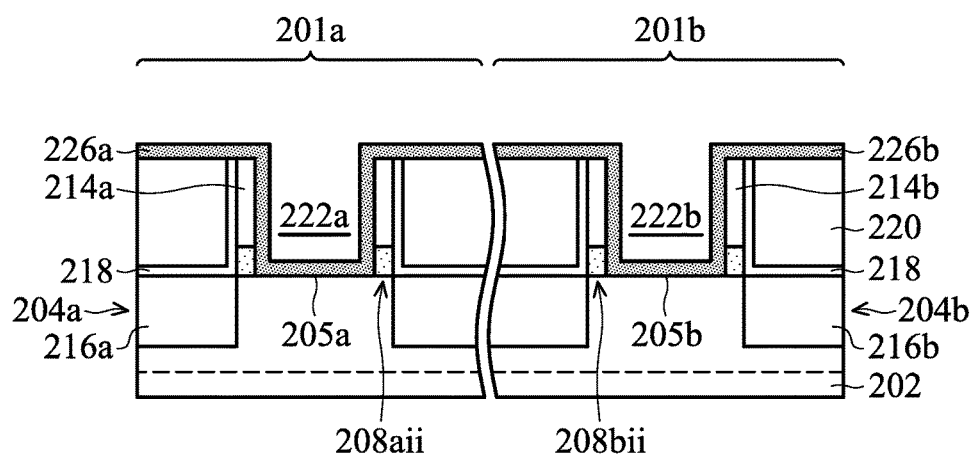

Afterwards, a first gate dielectric layer 226a is conformally formed over the first region 201a of the substrate 102, and a second gate dielectric layer 226b is conformally formed over the second region 201b of the substrate 102, as shown in FIG. 3F in accordance with some embodiments. The processes and materials used to form the first gate dielectric layer 226a and the second gate dielectric layer 226b may be similar to, or the same as, those of the gate dielectric layer 126 described previously and may not repeated herein.

In some embodiments, the first gate dielectric layer 226a and the second gate dielectric layer 226b are formed by performing a single deposition process. Since the first gate dielectric layer 226a and the second gate dielectric layer 226b may be formed by performing the same process, the first gate dielectric layer 226a and the second gate dielectric layer 226b may be made of the same material and may have a substantially equal thickness. In addition, the first gate dielectric layer 226a is thinner than the second portion 208aii of the first protection layer, and the second gate dielectric layer 226b is thinner than the second portion 208bii of the second protection layer in accordance with some embodiments.

Figure 3G:
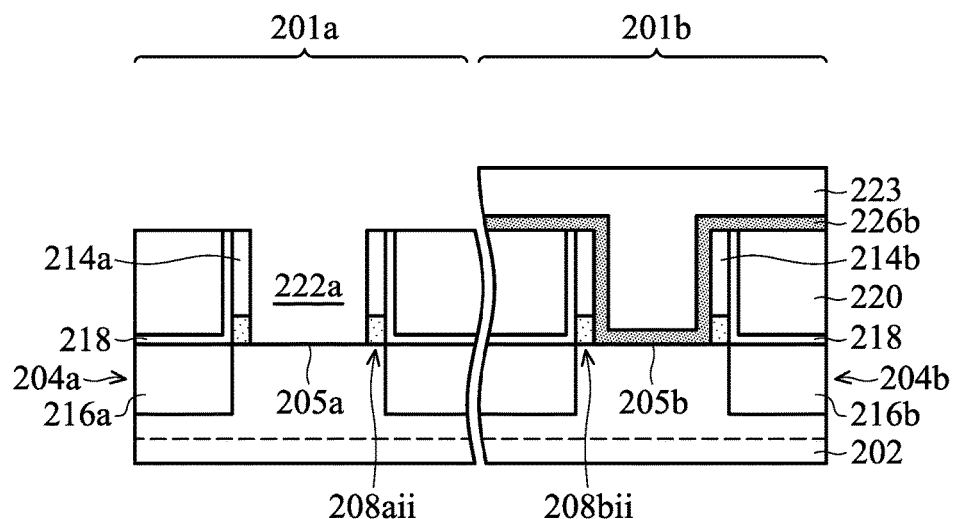

Next, a resist layer 223 is formed over the second region 201b of the substrate 102 to cover the second gate dielectric layer 226b, as shown in FIG. 3G in accordance with some embodiments. The resist layer 223 may be a photoresist layer formed over the second gate dielectric layer 226b and filled in the second trench 222b to protect the structure formed in the second region 201b of the substrate 102 during subsequent manufacturing processes. After the resist layer 223 is formed, the first gate dielectric layer 226a is removed, as shown in FIG. 3G in accordance with some embodiments.

Figure 3H:
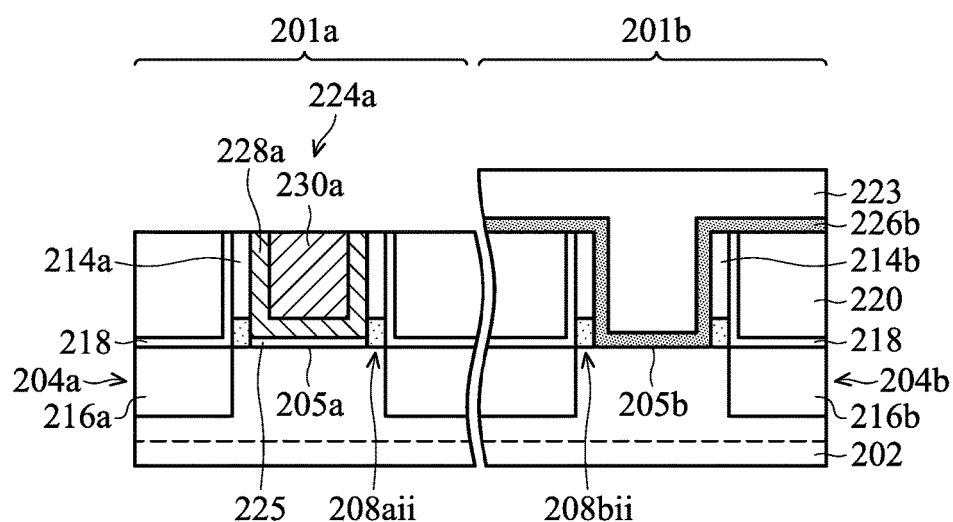

After the first gate dielectric layer 226a is removed, a first metal gate structure 224a is formed in the first trench 222a, as shown in FIG. 3H in accordance with some embodiments. In some embodiments, the first metal gate structure 224a includes an interfacial layer 225, a first work function metal layer 228a, and a first gate electrode layer 230a.

In some embodiments, the interfacial layer 225 is an oxide layer formed by reacting the top surface 205a of the first fin structure 204a with an acidic solution. In some embodiments, the interfacial layer 225 is thinner than the first gate dielectric layer 226a (i.e. thinner than the second gate dielectric layer 226b), so that the resulting first gate structure 224a can have a lower resistance. Therefore, the operation speed of the first gate structure 224a can be improved further. The processes and materials used to form the first work function metal layer 228a and the first gate electrode layer 230a may be similar to, or the same as, those used to form the work function metal layer 128 and the gate electrode layer 130 and are not repeated herein.

Figure 3I:
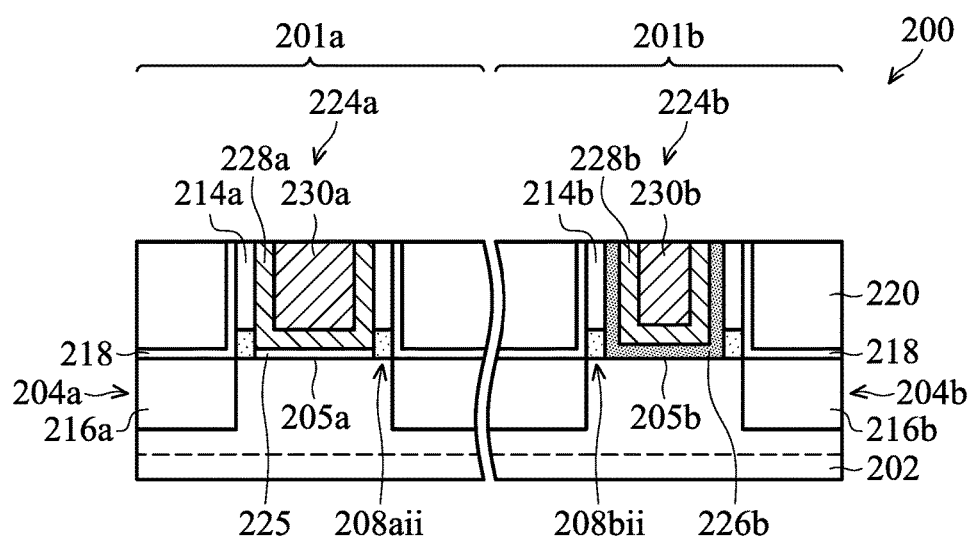

After the first metal gate structure 224a is formed, the resist layer 223 is removed, and a second metal gate structure 224b is formed in the second trench 222b, as shown in FIG. 3I in accordance with some embodiments. In some embodiments, the second metal gate structure 224b includes the second gate dielectric layer 226b formed previously, a second work function metal layer 228b, and a second gate electrode layer 230b. The processes and materials used to form the second work function metal layer 228b and the second gate electrode layer 230b may be similar to, or the same as, those used to form the work function metal layer 128 and the gate electrode layer 130 and are not repeated herein.

As described previously, the first protection layer 208a and the second protection layer 208b are formed over the first region 201a and the second region 201b of the substrate 102 to prevent the structures underneath from being damaged during subsequent manufacturing processes (e.g. the etching process which is used to form the first dummy gate structure 212a and the second dummy gate structure 212b). Accordingly, the second portion 208aii of the first protection layer 208a and the second portion 208bii of the second protection layer 208b remaining under the first spacers 214a and the second spacers 214b are relatively thick so that they can provide sufficient protection during the manufacturing processes.

However, since the first protection layer 208a and the second protection layer 208b are relatively thick, they may result in high resistance when used in a gate structure. Therefore, in the first metal gate structure 224a and the second gate structure 224b, the interfacial layer 225 and the second gate dielectric layer 226b are formed to replace the first portion 208ai of the first protection layer 208a and the second portion 208bi of the second protection layer 208b respectively.

In some embodiments, the second portion 208aii of the first protection layer is thicker than the interfacial layer 225, such that the interface between the second portion 208aii of the first protection layer is at a higher position than the top surface of the interfacial layer 225 (e.g. the bottom surface of the work function metal layer 228a). As described previously, the semiconductor structure 200 can have less substrate damage due to the formation of the first protection layer 208a while having a relatively low resistance due to the formation of the interfacial layer 225. As shown in FIG. 3I, the interfacial layer 225 is in direct contact with the second portion 208aii of the first protection layer but is not in direct contact with the first spacers 214a since the interfacial layer 225 is thinner than the second portion 208aii of the first protection layer in accordance with some embodiments. On the other hand, the sidewall of the first work function metal layer 228a is in direct contact with both the second portion 208aii of the first protection layer and the first spacers 214a in accordance with some embodiments.

In some embodiments, the second portion 208bii of the second protection layer is thicker than the second gate dielectric layer 226b, such that the interface between the second portion 208bii of the second protection layer is at a higher position than the bottom surface of the second work function metal layer 228b. Similarly, the semiconductor structure 200 can have less substrate damage due to the formation of the second protection layer 208b while having a relatively low resistance due to the formation of the second gate dielectric layer 226b. As shown in FIG. 3I, the second gate dielectric layer 226b is in direct contact with both the second portion 208bii of the second protection layer and the second spacers 214b in accordance with some embodiments. On the other hand, the sidewall of the second work function metal layer 228b is not in direct contact with neither the second portion 208bii of the second protection layer nor the second spacers 214b in accordance with some embodiments.

Furthermore, in some embodiments, the first region 201a is a core region and the second region 201b is an input/output region in the semiconductor structure 200. That is, the first gate structure 224a formed in the first region 201a may be used in a core device with a relatively high operating speed and greater current control. As described previously, the first protection layer 208a is formed over the first region 201a before the first dummy gate structure 212a is formed, so that damage to the structure underneath can be prevented and therefore the performance of the resulting semiconductor structure 200 can be improved. In addition, the first portion 208ai of the first protection layer 208a is replaced by the thin interfacial layer 225 in the first gate structure 224a, and therefore resistance can be decreased and the operation speed can be improved.

On the other hand, the second gate structure 224b formed in the second region 201b may be used in an input/output device to communicate with external circuits. Therefore, the first portion 208bi of the second protection layer 208b is replaced by the second gate dielectric layer 226b in the second gate structure 224b, so that the second gate dielectric layer 226b can be thin enough to have a relatively low resistance but still be thick enough to sustain the high voltage applied to the peripheral circuit. In addition, damage to the structure underneath the second protection layer 208b can also be prevented, and therefore the performance of the semiconductor structure 200 may be improved further.

In some embodiments, the difference between the thickness of the first protection layer 208a and that of the interfacial layer 225 is in a range from about 5 Å to about 80 Å. In some embodiments, the difference between the thickness of the second protection layer 208b and that of the second gate dielectric layer 226b is in a range from about 5 Å to about 70 Å. In some embodiments, the difference between the thickness of the first protection layer 208a and that of the interfacial layer 225 is greater than the difference between the thickness of the second protection layer 208b and that of the second gate dielectric layer 226b. Accordingly, the performance of the first gate structure 224a used in a core device and that of the second gate structure 224b used in an input/output device may both be improved.

Embodiments of methods for forming a semiconductor structure are provided. The method may include forming a relatively thick protection layer over a substrate, and a dummy gate structure is formed over the protection layer. Since the protection layer is formed before the dummy gate structure is formed, the substrate can be protected during the processes for forming the dummy gate structure. In addition, the portion of the protection layer located under the dummy gate structure may be replaced by a gate dielectric layer when the dummy gate structure is replaced by a metal gate structure. The gate dielectric layer may be thinner than the protection layer, so the resulting gate structure may have a lower resistance. Accordingly, the resulting semiconductor structure can have a relatively thin gate structure while the damage to the substrate in the semiconductor structure can be prevented by forming the protection layer.

In some embodiments, a method for forming a semiconductor structure is provided. The method for forming a semiconductor structure includes forming a protection layer having a first portion and a second portion over a substrate and forming a dummy gate structure over the first portion of the protection layer and forming a spacer on a sidewall of the dummy gate structure over a second portion of the protection layer. The method for forming a semiconductor structure further includes replacing the first portion of the protection layer and the dummy gate structure by a gate dielectric layer and a gate electrode layer. In addition, a thickness of the protection layer is greater than a thickness of the gate dielectric layer.

In some embodiments, a method for forming a semiconductor structure is provided. The method for forming a semiconductor structure includes forming a first protection layer over a first region of a substrate and a second protection layer over a second region of the substrate and forming a first dummy gate structure over the first protection layer and a second dummy gate structure over the second protection layer. The method for forming a semiconductor structure further includes forming first spacers over sidewalls of the first dummy gate structure and second spacers over sidewalls of the second dummy gate structure and removing the first dummy gate structure to form a first trench and removing the second dummy gate structure to form a second trench. The method for forming a semiconductor structure further includes removing the first protection layer exposed by the first trench and the second protection layer exposed by the second trench and forming a first gate dielectric layer in the first trench and a second gate dielectric layer in the second trench. The method for forming a semiconductor structure further includes removing the first gate dielectric layer to expose a portion of a top surface of the substrate and forming an interfacial layer over the portion of the top surface of the substrate exposed by the first trench. The method for forming a semiconductor structure further includes forming a first gate structure over the interfacial layer and forming a second gate structure over the second gate dielectric layer.

In some embodiments, a semiconductor structure is provided. The semiconductor structure includes a first gate structure formed over a first region of a substrate. In addition, the first gate structure includes an interfacial layer and a first gate electrode layer. The semiconductor structure further includes a first protection layer formed adjacent to the first gate structure and a first spacer formed over the first protection layer, such that a sidewall of the first gate structure is covered by the first protection layer and the first spacer. In addition, an interface between the first protection layer and the first spacer is at a higher position than a top surface of the interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a first protection layer having a first portion, a second portion and a third portion over a first portion of a substrate;
    forming a first dummy gate structure over the first portion of the first protection layer;
    forming a first spacer on a sidewall of the first dummy gate structure and over the second portion of the first protection layer;
    removing the third portion of the first protection layer which is exposed by the first dummy gate structure and the first spacer;
    replacing the first portion of the first protection layer and the first dummy gate structure by a first gate dielectric layer, wherein a thickness of the first protection layer is greater than a thickness of the first gate dielectric layer;
    replacing the first gate dielectric layer by an interfacial layer, wherein the thickness of the first gate dielectric layer is greater than a thickness of the interfacial layer; and
    forming a first gate electrode layer over the interfacial layer.

2. The method for forming a semiconductor structure as claimed in claim 1, wherein the thickness of the first protection layer is in a range from about 20 Å to about 100 Å.

3. The method for forming a semiconductor structure as claimed in claim 2, wherein a difference between the thickness of the first protection layer and the thickness of the first gate dielectric layer is in a range of about 5 Å to about 80 Å.

4. The method for forming a semiconductor structure as claimed in claim 1, wherein the first protection layer and the first gate dielectric layer are made of a same material.

5. The method for forming a semiconductor structure as claimed in claim 4, wherein the second portion of the first protection layer is in direct contact with the first gate dielectric layer.

6. The method for forming a semiconductor structure as claimed in claim 1, further comprising:
    forming a fin structure over the substrate;
    forming an isolation structure around the fin structure, wherein the first protection layer is formed over the fin structure and extends over the isolation structure.

7. The method for forming a semiconductor structure as claimed in claim 1, further comprising:
    forming a second protection layer having a first portion, a second portion and a third portion over a second portion of the substrate;
    forming a second dummy gate structure over the first portion of the second protection layer;
    forming a second spacer on a sidewall of the second dummy gate structure and over the second portion of the second protection layer;
    removing the third portion of the second protection layer which is exposed by the second dummy gate structure and the second spacer; and replacing the first portion of the second protection layer and the second dummy gate structure by a second gate dielectric layer and a second gate electrode layer, wherein the first gate dielectric layer and the second gate dielectric layer are formed by a single process.

8. A method for forming a semiconductor structure, comprising:
   forming a first protection layer over a first region of a substrate and a second protection layer over a second region of the substrate;
   forming a first dummy gate structure over the first protection layer and a second dummy gate structure over the second protection layer;
   forming first spacers over sidewalls of the first dummy gate structure and second spacers over sidewalls of the second dummy gate structure;
   removing the first dummy gate structure to form a first trench and removing the second dummy gate structure to form a second trench;
   removing the first protection layer exposed by the first trench and the second protection layer exposed by the second trench;
   forming a first gate dielectric layer in the first trench and a second gate dielectric layer in the second trench, wherein a thickness of the first protection layer is greater than a thickness of the first gate dielectric layer;
   removing the first gate dielectric layer to expose a portion of a top surface of the substrate;
   forming an interfacial layer over the portion of the top surface of the substrate exposed by the first trench;
   forming a first gate structure over the interfacial layer; and
   forming a second gate structure over the second gate dielectric layer.

9. The method for forming a semiconductor structure as claimed in claim 8, wherein the first gate dielectric layer and the second gate dielectric layer are formed by performing a same deposition process.

10. The method for forming a semiconductor structure as claimed in claim 8, wherein an interface between the first protection layer and the first spacer is at a higher position than a top surface of the interfacial layer.

11. The method for forming a semiconductor structure as claimed in claim 8, wherein the second protection layer is thicker than the second gate dielectric layer.

12. The method for forming a semiconductor structure as claimed in claim 8, wherein the first region is a core region and the second region is an input/output region.

13. The method for forming a semiconductor structure as claimed in claim 8, wherein the first protection layer is thicker than the second gate dielectric layer, and the second gate dielectric layer is thicker than the interfacial layer.

14. The method for forming a semiconductor structure as claimed in claim 8, wherein the first protection layer, the second protection layer and the second gate dielectric layer are made of a same material.

15. The method for forming a semiconductor structure as claimed in claim 14, wherein the first protection layer and the second protection layer are formed by performing a same deposition process.

16. A method for forming a semiconductor structure, comprising:
   forming a protection layer over a fin structure of a substrate;
   forming a dummy gate structure across the fin structure and over the protection layer;
   forming a spacer on a sidewall of the dummy gate structure and over the protection layer;
   removing the dummy gate structure to form a trench exposing a portion of the protection layer;
   removing the portion of the protection layer exposed by the trench, wherein a width of the protection layer is substantially the same as a width of the spacer after removing the portion of the protection layer;
   forming a gate dielectric layer in the trench, wherein the protection layer and the gate dielectric layer are made of a same material and a thickness of the protection layer is greater than a thickness of the gate dielectric layer;
   removing the gate dielectric layer to expose a portion of a top surface of the fin structure; and
   forming an interfacial layer over the portion of the top surface of the fin structure exposed by the trench, wherein the thickness of the protection layer is greater than a thickness of the interfacial layer.

17. The method for forming a semiconductor structure as claimed in claim 16, wherein the thickness of the protection layer is in a range from about 20 Å to about 100 Å.

18. The method for forming a semiconductor structure as claimed in claim 16, wherein the protection layer is an oxide layer.

19. The method for forming a semiconductor structure as claimed in claim 16, wherein the portion of the protection layer is in direct contact with the gate dielectric layer.

20. The method for forming a semiconductor structure as claimed in claim 16, further comprising:
   forming a gate electrode layer over the gate dielectric layer.

\* \* \* \* \*